United States Patent [19]
Yoo

[11] Patent Number: 5,324,689
[45] Date of Patent: Jun. 28, 1994

[54] CRITICAL DIMENSION CONTROL WITH A PLANARIZED UNDERLAYER

[75] Inventor: Chue-San Yoo, Taipei, Taiwan

[73] Assignee: Taiwan Semiconductor Manufacturing Company, Hsinchu, Taiwan

[21] Appl. No.: 102,976

[22] Filed: Jul. 28, 1993

[51] Int. Cl.$^5$ .................. H01L 21/44; H01L 21/469
[52] U.S. Cl. .......................... 437/228; 437/69; 437/191; 437/231; 156/653; 156/659.1
[58] Field of Search .......... 437/238, 231, 186, 228, 437/187, 229, 69, 191; 156/653, 657, 659.1, 662

[56] References Cited

U.S. PATENT DOCUMENTS

| | | | |
|---|---|---|---|
| 4,490,209 | 12/1984 | Hartman | 156/643 |
| 4,505,024 | 3/1985 | Kawate et al. | 437/228 |
| 4,541,892 | 9/1985 | Jeuch | 156/643 |
| 4,615,782 | 10/1986 | Namatsu et al. | 156/659.1 |
| 4,654,113 | 3/1987 | Tuchiya et al. | 156/643 |
| 4,775,550 | 10/1988 | Chu et al. | 427/38 |
| 4,971,655 | 11/1990 | Stefano et al. | 156/659.1 |
| 5,003,062 | 3/1991 | Yen | 437/231 |
| 5,013,398 | 5/1991 | Long et al. | 156/643 |
| 5,017,513 | 5/1991 | Takeuchi | 437/228 |
| 5,069,747 | 12/1991 | Cathey et al. | 156/643 |
| 5,094,712 | 3/1992 | Becker et al. | 156/643 |
| 5,100,503 | 3/1992 | Allamn et al. | 156/643 |
| 5,116,460 | 5/1992 | Bukhman | 156/643 |
| 5,118,387 | 6/1992 | Kadomura | 156/657 |
| 5,126,289 | 6/1992 | Ziger | 437/231 |
| 5,167,762 | 12/1992 | Carr et al. | 156/657 |
| 5,201,993 | 4/1993 | Langley | 156/643 |

*Primary Examiner*—T. N. Quach
*Attorney, Agent, or Firm*—George O. Saile

[57] ABSTRACT

A new method of controlling the critical dimension width of polysilicon by planarizing the photoresist underlayer is described. A semiconductor substrate is provided wherein the surface of the substrate has an uneven topography. A layer of polysilicon is deposited over the uneven surface of the substrate. The polysilicon layer is covered with a spin-on-glass layer wherein the spin-on-glass material planarizes the surface of the underlying topography. The spin-on-glass layer is covered with a uniform thickness layer of photoresist. The photoresist layer is exposed through the desired mask, developed and patterned to form the desired resist mask. The exposed spin-on-glass and polysilicon layers are removed by etch. The photoresist mask is stripped. The spin-on-glass layer remaining over the polysilicon patterned layer is removed, resulting in the polysilicon layer having the desired uniform critical dimension.

17 Claims, 3 Drawing Sheets

CRITICAL DIMENSION CONTROL WITH A PLANARIZED UNDERLAYER

BACKGROUND OF THE INVENTION (1) Field of the Invention

The invention relates to a method of controlling the critical dimension width of polysilicon, and more particularly, to a method of controlling the critical dimension width of polysilicon by planarizing the photoresist underlayer using a spin-on-glass layer in the manufacture of integrated circuits.

(2) Description of the Prior Art

Referring to FIG. 1, there is shown a portion of a partially completed integrated circuit in which there is a silicon substrate 10. Field oxide regions 12 are formed in and on the silicon substrate resulting in a uneven topography of the top surface of the substrate. A layer 14 of polysilicon is deposited over the surface of the substrate. A layer of photoresist 16 coats the surface of the polysilicon layer 14 and planarizes the substrate. The differing photoresist depths A and B will make an imperfect image and resulting mask.

FIG. 2 shows a top view of the active area 20 of the semiconductor substrate. Field oxide regions 12 surround the active area. This figure illustrates the necking problem 17 of the PRIOR ART in polysilicon region 14, especially for areas having a large change in topography such as the field oxide to active areas. The differing photoresist thicknesses cause the different critical dimension width of the polysilicon due to the standing-wave effect. This necking problem could result in early breakdown of the integrated circuit via the neck, 17. The circuit critical dimension (CCD), Testline, and Testkey can differ by as much as 0.15 micrometers. Testline and testkey are process monitor patterns having the same dimension as the CCD, but different surrounding patterns.

U.S. Pat. Nos. 5,003,062 to Yen and 4,775,550 to Chu et al describe processes for planarization using spin-on-glass materials. These Patents are cited to show the general use of spin-on glass materials in the art.

SUMMARY OF THE INVENTION

A principal object of the present invention is to provide an effective and very manufacturable method of providing a necking-free and uniform critical dimension width for polysilicon across an uneven topography.

Another object of the present invention is to provide a method of critical dimension control which will not impact or disturb the final device characteristics.

In accordance with the objects of this invention a new method of controlling the critical dimension width of polysilicon by planarizing the photoresist underlayer is achieved. A semiconductor substrate is provided wherein the surface of the substrate has an uneven topography. A layer of polysilicon is deposited over the uneven surface of the substrate. The polysilicon layer is covered with a spin-on-glass layer wherein the spin-on-glass material planarizes the surface of the underlying topography. The spin-on-glass layer is covered with a uniform thickness layer of photoresist. The photoresist layer is exposed through the desired mask, developed and patterned to form the desired resist mask. The exposed spin-on-glass and polysilicon layers are removed by etch. The photoresist mask is stripped. The spin-on-glass layer remaining over the polysilicon patterned layer is removed, resulting in the polysilicon layer having the desired uniform critical dimension.

BRIEF DESCRIPTION OF THE DRAWINGS

In the accompanying drawings forming a material part of this description, there is shown.

DESCRIPTION OF THE PREFERRED EMBODIMENTS

Figure 3:
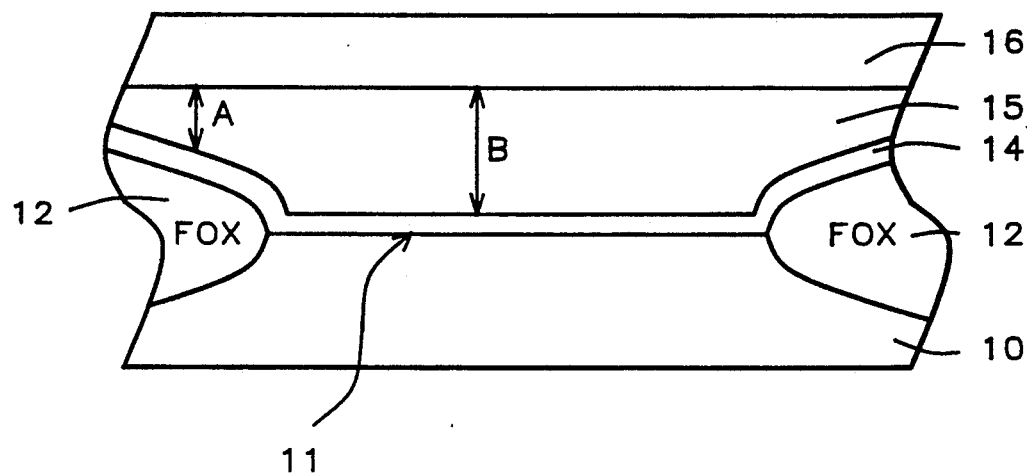
FIG. 3 schematically illustrates in cross-sectional representation one preferred embodiment of the present invention.

Referring now more particularly to FIG. 3, the process of the present invention will be described. A portion of a partially completed integrated circuit is illustrated in FIG. 3 consisting of a semiconductor substrate 10, preferably composed of monocrystalline silicon. Field oxide regions 12 have been formed as is conventional in the art in the semiconductor substrate 10 resulting in an uneven topography of the surface of the substrate. The height of the field oxide regions 12 over the surface 11 of the active region of the substrate may be from 1500 to 2000 Angstroms. A layer 14 of polysilicon is deposited over the uneven surface of the substrate to a thickness of, for example between about 4500 to 5000 Angstroms.

A spin-on-glass material 15, either a silicate or a siloxane, is deposited over the polysilicon layer 14. The spin-on-glass material suspended in the vehicle or solvent is deposited onto the semiconductor wafer surface and uniformly spread thereover by the action of spinning the wafer, for example, at 3500 revolutions per minute. The spin-on-glass material fills in the indentations and smooths the integrated circuit wafer surface. The spin-on-glass material is now baked at a temperature of between about 100° to 250° C. to remove the solvent and fix the layer. It is not necessary to cure the spin-on-glass material, but the layer could be cured at between about 400° to 450° C. In fact, the spin-on-glass layer will be easier to remove if it is uncured.

Figure 1:
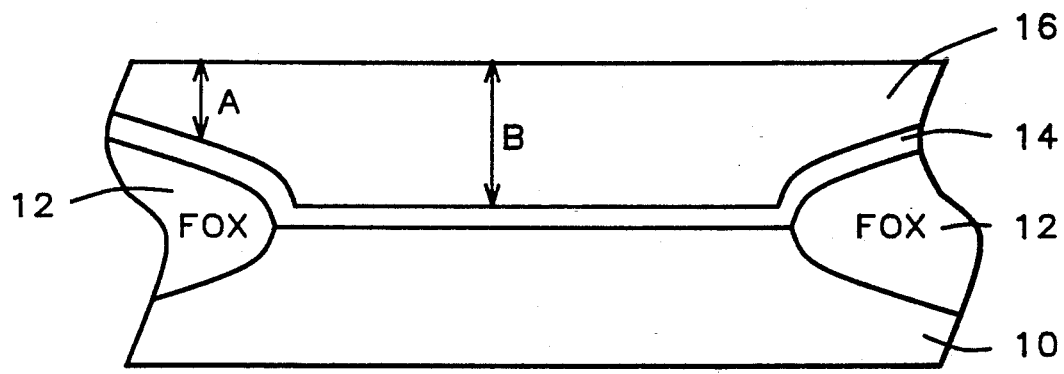
FIGS. 1 and 2 schematically illustrate in cross-sectional representation some drawbacks of the conventional PRIOR ART process.

The photoresist layer 16 is deposited over the planarized surface of the wafer thus allowing a uniform thickness of the photoresist layer. The differing thicknesses A and B are within the spin-on-glass coating rather than within the photoresist as in the prior art (FIG. 1). When the photoresist is exposed, developed and etched to form the pattern mask, the necking problem of the prior art will not occur because the photoresist has a uniform thickness.

The exposed spin-on-glass 15 layer is etched using anisotropic reactive ion etching with fluorine chemistry. The polysilicon layer 14 is etched with a reactive ion etching using HBr, or chlorine-bases chemistry such as $Cl_2$, $CCl_4$, etc., as the reactive ion. The photoresist mask is stripped using conventional methods, such as oxygen ashing. A polymer is formed on the sidewalls of the polysilicon during the etching. A hydrofluoric acid dip etch is used to remove the spin-on-glass material 15 as well as the polymer buildup. A typical concentration would be H₂O (50):HF (1) for approximately 10 seconds.

Figure 2:
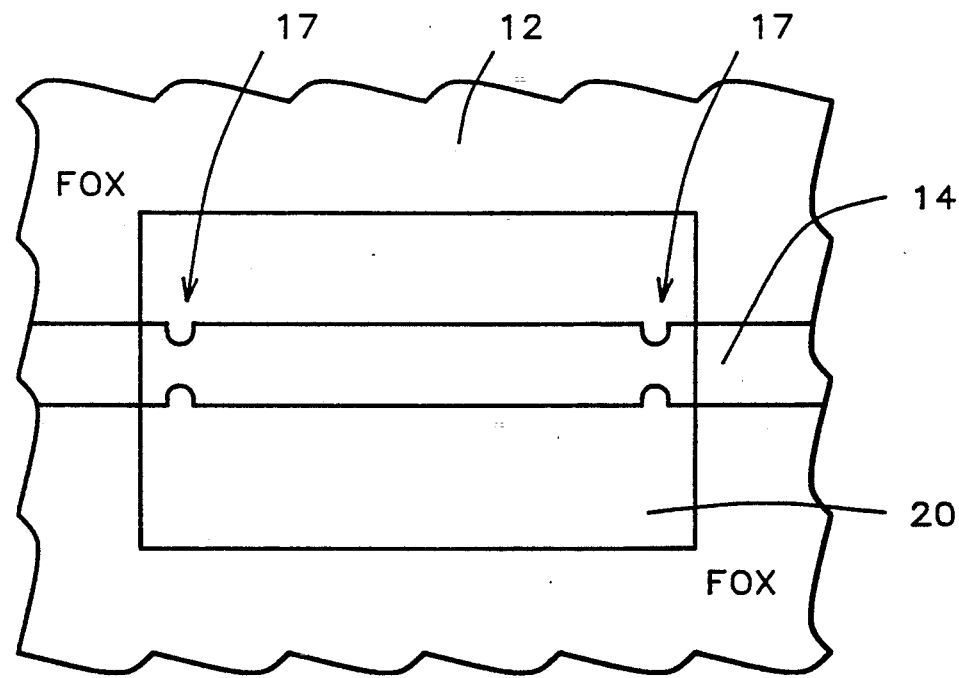
Figure 4:
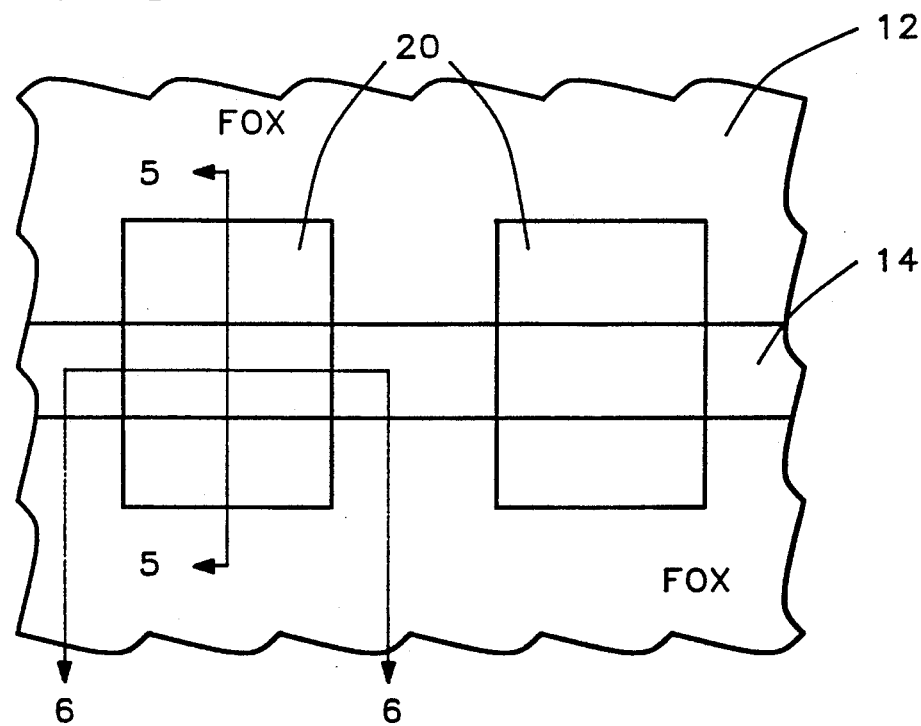
FIG. 4 schematically illustrate in top-view representation one preferred embodiment of the present invention.

FIG. 4 illustrates a top view of the active regions 20 of the integrated circuit after etching and removal of the spin-on-glass material. Field oxide areas are illustrated by 12. It can be seen that there is no necking of the polysilicon region 14 as there was in the prior art, illustrated by 17 in FIG. 2.

Figure 5:
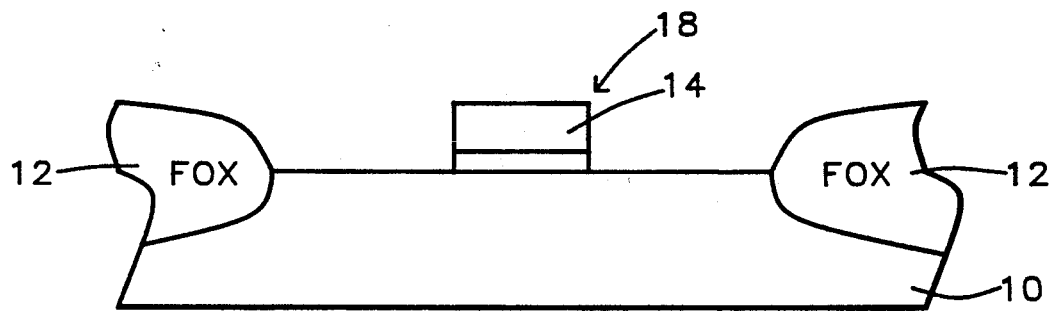
FIGS. 5 and 6 schematically illustrate in cross-sectional representation one preferred embodiment of the present invention.
Figure 6:
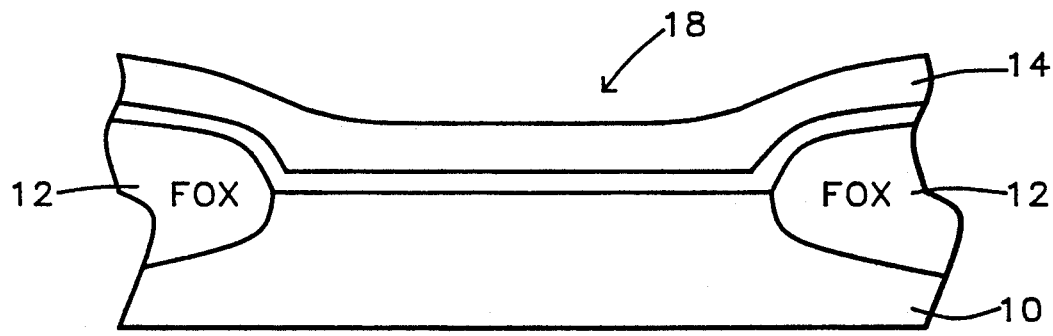

FIG. 5 shows the view 5—5 of FIG. 4, illustrating the gate electrode 18 between field oxide regions 12. FIG. 6 illustrates the view 6—6 of FIG. 4. The polysilicon region 14 over the gate dielectric layer (unnumbered) is shown covering field oxide regions 12 and substrate 10. FIGS. 5 and 6 show the gate electrode enlarged and including a gate dielectric layer (unnumbered). Other figures, for simplicity's sake, do not show the gate dielectric layer under layer 14.

The process of the present invention results in a necking-free polysilicon critical dimension which is good for transistor performance. The spin-on-glass material used to planarize the photoresist underlayer is easy to apply by spinning and easy to remove. If any residue is left on the surface of the polysilicon, it will be oxidized to silicon dioxide and not be a problem as a contaminant in the integrated circuit.

While the invention has been particularly shown and described with reference to the preferred embodiments thereof, it will be understood by those skilled in the art that various changes in form and details may be made without departing from the spirit and scope of the invention.

What is claimed is:

1. The method of planarizing an integrated circuit while controlling the critical dimension of polysilicon layer during etching in the formation of a polysilicon gate electrode comprising:
   providing semiconductor device structures including bare active areas surrounded by field oxide isolation on a semiconductor substrate wherein the surface of said substrate has an uneven topography due to the uneven interface between said active areas and said isolation;
   depositing said polysilicon layer over said active areas and said field oxidation of said substrate wherein the width of said polysilicon layer is said critical dimension;
   covering said polysilicon layer with a spin-on-glass layer wherein said spin-on-glass planarizes the surface of said substrate;
   covering said spin-on-glass layer with a uniform thickness layer of photoresist;
   exposing, developing and patterning said photoresist layer to form the desired photoresist mask for said polysilicon layer;
   anisotropically etching said exposed spin-on-glass and polysilicon layers wherein said etching said polysilicon causes a polymer to form on the sidewalls of said polysilicon;
   removing said photoresist mask; and
   simultaneously removing and spin-on-glass layer and said polymer to complete said polysilicon gate electrode having said critical dimension in said integrated circuit.

2. The method of claim 1 wherein said spin-on-glass material is siloxane.

3. The method of claim 1 wherein said spin-on-glass material is a silicate.

4. The method of claim 1 wherein said spin-on-glass layer is etched by anisotropic etching using fluorine chemistry.

5. The method of claim 1 wherein said polysilicon layer is etched by reactive ion etching using HBr as the reactive agent.

6. The method of claim 5 wherein said polymer and said spin-on-glass layer are removed by a hydrofluoric acid dip etch.

7. The method of claim 1 wherein said polysilicon layer is etched by reactive ion etching using chlorine chemistry as the reactive agent.

8. The method of claim 7 wherein said polymer and said spin-on-glass layer are removed by a hydrofluoric acid dip etch.

9. The method of etching a polysilicon layer while controlling the critical dimension of the polysilicon layer to be uniform comprising:
   providing a substrate wherein the surface of said substrate has an uneven topography;
   depositing said polysilicon layer over said uneven surface of said substrate wherein the width of said polysilicon layer is said critical dimension;
   covering said polysilicon layer with a spin-on-glass layer wherein said spin-on-glass planarizes the surface of said substrate;
   covering said spin-on-glass layer with a uniform thickness layer of photoresist;
   exposing, developing and patterning said photoresist layer to form the desired photoresist mask for said polysilicon layer;
   anisotropically etching said exposed spin-on-glass and polysilicon layers down to said substrate wherein said etching said polysilicon causes a polymer to form on the sidewalls of said polysilicon;
   removing said photoresist mask; and
   simultaneously removing said spin-on-glass layer and said polymer to complete said polysilicon layer having said critical dimension.

10. The method of claim 9 wherein said spin-on-glass material is siloxane.

11. The method of claim 9 wherein said spin-on-glass material is a silicate.

12. The method of claim 9 wherein said spin-on-glass layer is etched by anisotropic etching using fluorine chemistry.

13. The method of claim 9 wherein said polysilicon layer is etched by reactive ion etching using HBr as the reactive agent.

14. The method of claim 13 wherein said polymer and said spin-on-glass layer are removed by a hydrofluoric acid dip etch.

15. The method of claim 19 wherein said polysilicon layer is etched by reactive ion etching using chlorine chemistry as the reactive agent.

16. The method of claim 15 wherein said polymer and said spin-on-glass layer are removed by a hydrofluoric acid dip etch.

17. The method of claim 9 wherein said spin-on-glass layer is uncured during the processing.

* * * * *